United States Patent

Hall et al.

[11] Patent Number: 5,876,808
[45] Date of Patent: Mar. 2, 1999

[54] PLASMA ENHANCED OMCVD OF THIN FILM COATING FOR POLYMERIC FIBERS

[75] Inventors: Lauren A. Hall, Hacienda Heights, Calif., now by change of name from Lauren M. Atagi; David J. Devlin, Los Alamos, N. Mex.; David C. Smith, Santa Clara, Calif.

[73] Assignee: The Regents of the University of California, Los Alamos, N. Mex.

[21] Appl. No.: 816,321

[22] Filed: Mar. 13, 1997

Related U.S. Application Data

[60] Provisional application No. 60/013,429, Mar. 14, 1996.
[51] Int. Cl.$^6$ ................. H05H 1/20; H05H 1/30
[52] U.S. Cl. ................ 427/573; 427/575; 427/576
[58] Field of Search ................. 427/573, 575, 427/576, 446, 569, 562, 564, 255.2

[56] References Cited

U.S. PATENT DOCUMENTS

| 4,600,202 | 7/1986 | Schaeffler et al. | 277/53 |
|---|---|---|---|
| 5,089,438 | 2/1992 | Katz | 437/184 |
| 5,173,327 | 12/1992 | Sandhu et al. | 427/576 |
| 5,246,881 | 9/1993 | Sandhu et al. | 427/573 |
| 5,290,609 | 3/1994 | Horiike et al. | 427/576 |
| 5,344,792 | 9/1994 | Sandhu et al. | 117/939 |
| 5,413,851 | 5/1995 | Storer | 428/361 |
| 5,711,987 | 1/1998 | Bearinger et al. | 427/577 |

OTHER PUBLICATIONS

F. J. McGarry et al., "Ceramic Coated Rigid Rod Polymer Fibers," SAMPE Quarterly, Jul. 1992, pp. 35–38.

Fix et al, "Titanium Nitride Thin films: Properties & APCVD Synthesis using organometallic precursors", *Mat. Resch. Soc. Symposium Proc.,* vol. 2(3) pp. 357–362, 1990 No month.

Fix et al, "Synthesis of Thin Films by Atmospheric Pressure Chemical Vapor Deposition Using Amido and Zmido Titanium(IV) Compounds as Precursors", *Chem. Mater.,* 1990, 2, pp. 235–241, 1990 No month.

*Primary Examiner*—Marianne Padgett
*Attorney, Agent, or Firm*—Bruce H. Cottrell

[57] ABSTRACT

A plasma enhanced chemical vapor deposition process for depositing a titanium nitride film on a polymeric substrate is provided, the process including placing the polymeric substrate within a chemical vapor deposition chamber evacuated to a pressure within a range of from about 0.1 Torr to about 10 Torr, heating the polymeric substrate to a temperature within a range of from about 150° C. to about 250° C., introducing a vaporized organometallic compound and ammonia gas into the chamber, generating a plasma within the chamber, and, maintaining the polymeric substrate within the chamber for a time sufficient for a layer of titanium nitride to deposit upon the polymeric substrate.

5 Claims, 2 Drawing Sheets

Precursor Delivery to the Plasma Reactor

Precursor Delivery to the Plasma Reactor

PLASMA ENHANCED OMCVD OF THIN FILM COATING FOR POLYMERIC FIBERS

This application claims the benefit of U.S. Provisional Application No. 60/013,429 Mar. 14, 1996, now abandoned.

FIELD OF THE INVENTION

The present invention relates to plasma enhanced organometallic chemical vapor deposition of thin film coatings onto polymeric fibers. More particularly, the present invention relates to plasma enhanced organometallic chemical vapor deposition of thin film coatings of titanium nitride (TiN) onto polymeric aramid fibers such as KEVLAR® aramid fibers. This invention is the result of a contract with the Department of Energy (Contract No. W-7405-ENG-36).

BACKGROUND OF THE INVENTION

Since at least the early 1960's, liquid crystalline polymers have been used to produce high strength fibers. Well known examples of these types of fibers include aramid fibers made from highly-oriented rod-like polymers of poly (paraphenylene terephthalamide), well known as KEVLAR® aramid fibers commercially available from E.I. du Pont de Nemours and Company, Wilmington, Del. or Twaron fibers, commercially available from Akzo Nobel NV, Netherlands. These aramid fibers provide exceptional tenacity and a high tensile modulus. Breaking strengths of 2.3–3.4 gigapascals (GPa) with a modulus of 55–143 GPa are typical for these fibers. This, combined with their low specific gravity and thermal stability, has resulted in improved performance in many structural applications such as aircraft, boats, sporting goods, missiles and armor. However, a major drawback of these types of fibers has been their relatively poor flexural rigidity and compressive properties. Compressive force along the fiber axis causes buckling, which results in fiber breakdown. Fibers yield at low values of stress on the order of 400 megapascals (MPa) with the formation of kink bands.

In order to alleviate this difficulty, much effort has gone into attempts to cross-link the polymer in the filaments, but to date there has been little success. Another approach has been to coat the fiber with a sufficiently high modulus material to, in effect, "girdle" the filament and prevent buckling. Early work by McGarry et al., SAMPE Quarterly, p. 35, July 1992, demonstrated the effectiveness of this approach with vapor deposited alumina coatings. Other coatings for KEVLAR® aramid fibers with potential for improving the mechanical properties of the fibers have been explored. Recently, enhanced properties have been reported for diamond-like carbon (DLC) coatings on KEVLAR® aramid fibers.

Chemical vapor deposition (CVD) involves the reaction of gas phase species with a heated surface, resulting in a thin coating of a solid material. This process allows for greater dispersion of the chemicals to provide uniform coatings on complex shapes. One of the limitations of CVD is the high surface temperatures (>600° C.) required for depositions. Temperature sensitive substrates like polymeric fibers such as Kevlar® aramid fibers may be damaged under these conditions.

Thus, an object of the invention is to provide a process for the chemical vapor deposition of thin coatings on polymeric fibers.

Another object of the invention is to provide a process for the chemical vapor deposition of thin coatings of TiN on polymeric fibers and particularly onto polymeric fibers such as Kevlar® aramid fibers.

Another object of this invention is to provide an thin film coated polymeric article such as a TiN coated polyaramid fiber.

SUMMARY OF THE INVENTION

To achieve the foregoing and other objects, and in accordance with the purposes of the present invention, as embodied and broadly described herein, the present invention provides a plasma enhanced chemical vapor deposition process for depositing a titanium nitride film on a polymeric substrate, the process including placing the polymeric substrate within a chemical vapor deposition chamber evacuated to a pressure within a range of from about 0.1 Torr to about 10 Torr, heating the polymeric substrate to a temperature within a range of from about 150° C. to about 250° C., introducing a vaporized organometallic compound and ammonia gas into the chamber, generating a plasma within the chamber, and, maintaining the polymeric substrate within the chamber for a time sufficient for a layer of titanium nitride to deposit upon the polymeric substrate.

The present invention further provides a composite structure including a polyaramid fiber, and, a thin coating of titanium nitride directly adjacent said polyaramid fiber.

DETAILED DESCRIPTION

Figure 1:
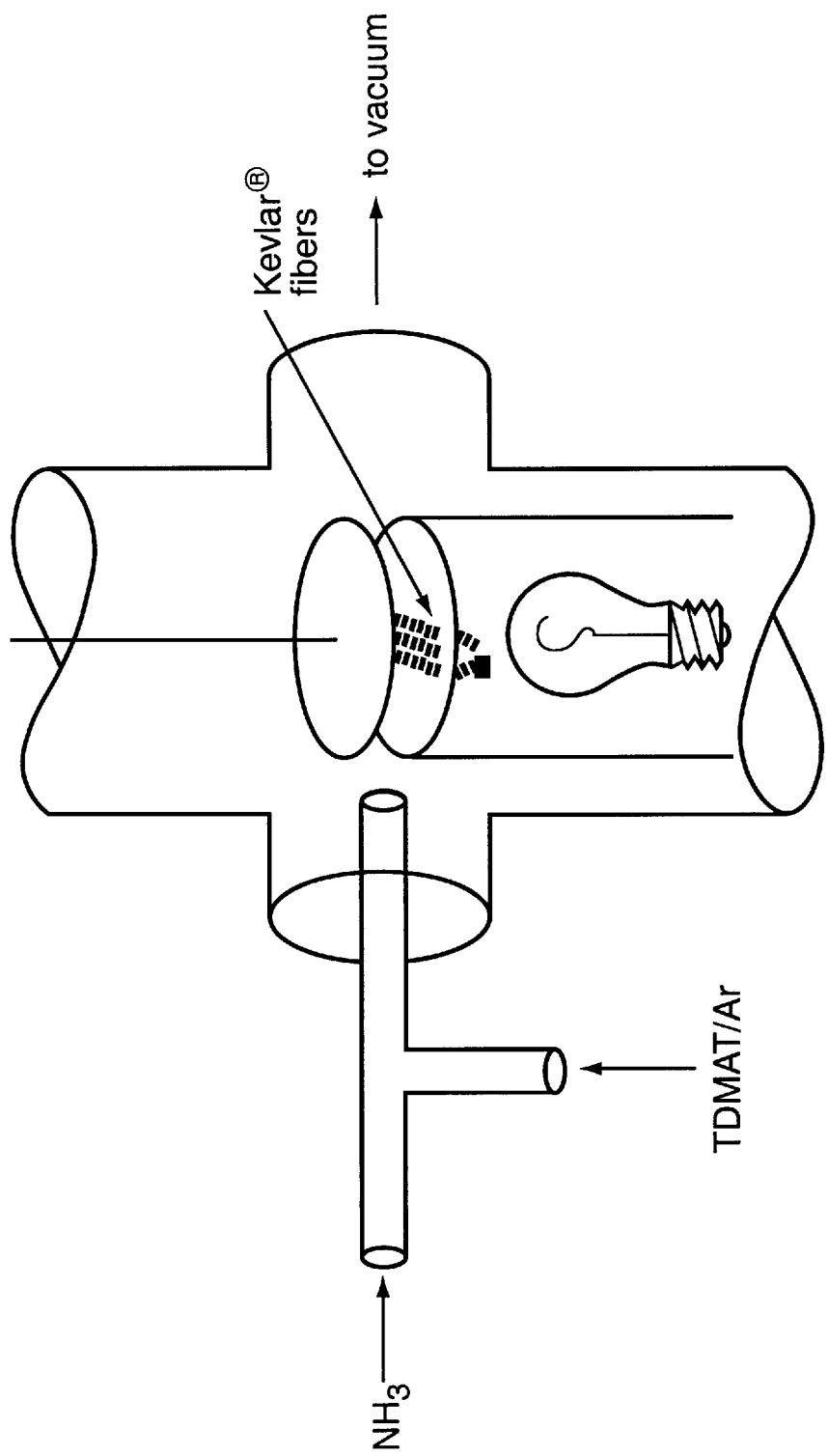
FIG. 1 is an schematic drawing of a deposition chamber used to carry out the organometallic chemical vapor deposition (OMCVD) process of the present invention.

The present invention is concerned with the use of plasma enhanced chemical vapor deposition to coat a polymeric substrate, e.g., polymeric fibers, with a protective sheath of a material. On polymeric fibers, such a protective sheath such as titanium nitride can improve fiber durability.

Chemical vapor deposition (CVD) involves the reaction of gas phase species with a heated surface, resulting in a thin coating of a solid material. This process allows for greater dispersion of the chemicals to provide uniform coatings on complex shapes. One of the limitations of CVD is the high surface temperatures (>600° C.) required for depositions. Temperature sensitive substrates like Kevlar® aramid fibers may be damaged under these conditions. This problem has now been circumvented by using a plasma containing many highly active chemical species, which allows deposition to occur well below the breakdown temperature of Kevlar® aramid fibers (about 400° C.).

The deposition process takes place in a low pressure chamber, such low pressures generally between about 0.1 Torr and 100 Torr, preferably between about 0.1 Torr and 10 Torr. The process utilizes organometallic precursors such as tetrakis-dialkylamido titanium wherein the alkyl group can generally be methyl, ethyl, propyl or butyl.

Additionally, combinations of such compounds may be used. Also, other organometallic titanium compounds which have bonds with reactivities similar to those of tetrakis-dialkylamido titanium will likely react in a similar manner to provide similar results.

In addition to the organometallic precursor, ammonia gas is introduced into the deposition chamber. Generally, the ratio between the organometallic precursor and the ammonia gas is 1:10. Such a ratio can be established by adjustment of the flow rates of the different gases into the deposition chamber.

The plasma used in the process is conveniently formed by a high frequency microwave discharge between an electrode and a metal stage used for support of the fibrous substrates. In one manner of forming the plasma, the microwave plasma is generated by a 2.45 gigahertz (GHz) discharge between a top copper electrode of the deposition chamber and a bottom stainless steel substrate stage. The plasma may also be formed by an RF or DC process.

An inert carrier gas is used to carry the vapors of the organometallic compound into the deposition chamber. Generally, the inert carrier gas can be a noble gas such as helium, neon, argon and the like or may be nitrogen. Argon is generally preferred as the carrier gas.

The target substrate in the present invention is generally heated at a temperature well beneath its decomposition temperature. For Kevlar® aramid fibers (having a decomposition temperature of about 400° C.), the substrate temperature is generally from about 150° C. to about 250° C., although with the gas phase reactivity of selected organometallic reactive species temperatures as low as about 50° C. or as low as 20° C. may be suitable.

The polymeric substrate, e.g., polymeric fibers, that can be coated in the present process can generally be of any organic polymer material. One preferred class of materials for coating in the present process are liquid crystalline polymers and an especially preferred type of polymeric fiber is polyaramid fibers such as Kevlar® aramid fibers.

In specific examples of the present invention, titanium nitride films were deposited directly on the Kevlar® aramid fibers at very low temperatures (150°–250° C.) in a microwave argon/ammonia plasma using an organometallic precursor such as the organometallic precursor tetrakis (dimethylamido)-titanium, $Ti(NMe_2)_4$. Depositions were performed in a low pressure, stainless steel reactor as shown in FIG. 1 equipped with quartz windows to observe the plasma glow. The liquid organometallic precursor, tetrakis (dimethylamido)-titanium (TDMAT), was loaded into a bubbler and attached to the system using VCR® fittings. The bubbler and the inlet lines were left at ambient temperature (24° C.) during deposition. The stainless steel stage was heated internally using a quartz lamp. The deposition temperature was monitored using a thermocouple inserted into the stage. A 1.5 inch long bundle of fibers (containing approximately 75–100 fibers) was affixed perpendicularly to the precursor flow using silver paste on each end of the bundle. The actual temperature of the fibers suspended across the stage could not be measured directly. Argon (ultra high purity) and ammonia (semiconductor grade) flow rates were regulated by mass flow controllers. The process pressure was measured and maintained using a baratron capacitance manometer equipped with an adjustable butterfly valve. Typical deposition conditions are listed below in Table 1.

TABLE 1

Typical Parameters for Deposition of TiN Thin Films on Kevlar ® aramid fibers

| | |
|---|---|
| Precursors | $Ti[N(CH_3)_2]_4 + NH_3$ |
| Carrier Gas | Argon |
| Stage Temperature | 200° C. to 230° C. |
| Chamber Pressure | 0.10 Torr to 10 Torr |
| Plasma Generation means | 2.45 gigahertz (GHz) microwave |
| Film Growth Rate | about 0.1 μm per minute |
| Deposition Time | 2 minutes to 10 minutes |

The deposition rates were high, with titanium nitride films of over 3 microns thick deposited in less than 20 minutes, however better adhesion was observed with thin films (<0.5 microns) deposited over a 5–10 minute period. Pretreatment of fibers in an oxygen plasma had no effect on the adhesion of the coatings. Scanning electron microscopy was used to analyze the morphology of the films. The titanium nitride films demonstrated columnar growth on the Kevlar® aramid fibers, giving the appearance of cylinders wrapped with a dense carpet or rug. The coatings were uniform along the length of the fiber and gave good conformal coverage.

Figure 2:
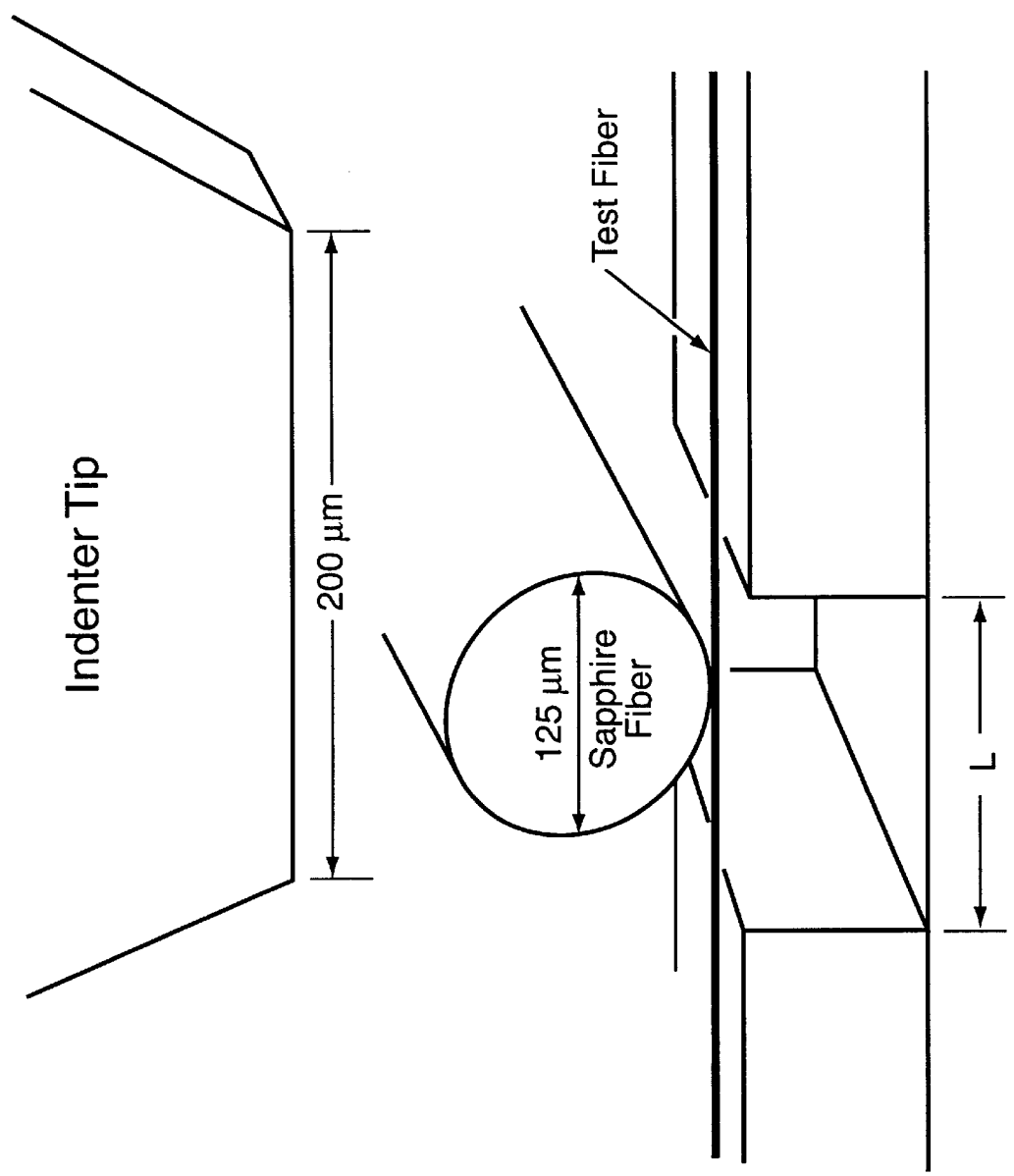
FIG. 2 is an schematic drawing of a flex bending test apparatus used in testing the articles of the present invention.

The effects of these coatings on the properties of the fibers were examined using a flexure test for such small diameter fibers as described in U.S. provisional patent application number 60/007,849, by Devlin et al., entitled "Flexural Test for Small Diameter Fibers," filed on Dec. 1, 1995, refilled as Ser. No. 08/755,439 on Nov. 22, 1996, now abandon, such description incorporated herein by reference. The instrument was specially designed to measure the performance of an individual fiber as it responds to increasing force in a three-point bend configuration as shown in FIG. 2. The modulus and the yield performance of a fiber can be calculated from the load vs. displacement data. This apparatus is useful for many types of fibers, with excellent reproducibility and accuracy.

The moduli measured for uncoated Kevlar® aramid fibers and silicon carbide fibers agree with the literature values shown in Table 2 below. All samples in table 2 were tested on the flexure testing apparatus mentioned above to measure the load versus displacement response in a three-point bend configuration. Calculation of the fiber modulus from the load versus displacement data assumes uniform properties over the diameter of the fiber. However, this assumption breaks down when calculating the modulus for a coated fiber. The response of a coated fiber is not simply equivalent to a weighted average value of the Kevlar® aramid fibers and TiN moduli spread evenly over the total diameter of the coating and the fiber. For example, the measured "composite" modulus for the TiN coated Kevlar® aramid fibers is only 31±3 GPa, a value much lower than either pure Kevlar® aramid fibers or pure TiN. A more useful number is found by calculating a modulus for the TiN coating of the Kevlar® aramid fibers, assuming the TiN is a hollow cylinder. This value (114±5 GPa) agrees with the modulus measured for a thin film of TiN on silicon (116±5 GPa), indicating the TiN coating is enduring the load and protecting the inner Kevlar® aramid fibers as desired. Further evidence that the TiN coating is suppressing fiber buckling is indicated by the increased yield performance of the coated fiber. Comparison of TiN coated Kevlar® aramid fibers with uncoated Kevlar® aramid fibers shows the coated fibers can endure higher loads (ca. 60% yield load improvement.)

TABLE 2

Modulus (E) and Yield Displacement (δ) on Individual Fibers

| | Nicalon SiC | Uncoated Kevlar ® aramid fibers | Kevlar ® aramid fibers with 0.5 μm TiN |
|---|---|---|---|
| $E_{measured}$ (GPa) | 194 ± 7 | 77 ± 6 | 114 ± 5* |
| | | | 31 ± 3** |
| $E_{literature}$ (GPa) | 180–200 | 83 | |
| δ (nm) | | 2.2 μm | 3.6 μm |

*This value for the modulus assumes the load versus displacement response of the Kevlar ® aramid fibers coated with 0.5 μm TiN is dominated by the properties of the hollow cylinder of TiN.
**This value is for the "composite" modulus, i.e., assuming the response is evenly distributed over the diameter of the Kevlar ® aramid fibers and the TiN coating.

The results of the present description show that the use of plasma CVD, e.g., microwave plasma CVD, for the low temperature deposition of thin films of titanium nitride on these Kevlar® aramid fibers and other fibers offers a viable route to new coatings that may improve fiber quality and expand future applications.

Although the present invention has been described with reference to specific details, it is not intended that such details should be regarded as limitations upon the scope of the invention, except as and to the extent that they are included in the accompanying claims.

What is claimed is:

1. A plasma enhanced chemical vapor deposition process for depositing a titanium nitride film on a liquid crystalline polymeric fiber, said process comprising:

placing said polymeric fiber within a chemical vapor deposition chamber evacuated to a pressure within a range of from about 0.1 Torr to about 10 Torr;

heating said polymeric fiber to a temperature within a range of from about 150° C. to about 250° C.;

introducing a vaporized organometallic compound and ammonia gas into said chamber;

generating a plasma within said chamber; and, maintaining said polymeric fiber within said chamber for a time sufficient for a layer of titanium nitride to deposit upon said polymeric fiber.

2. The process of claim 1 wherein said polymeric fiber is a polyaramid fiber.

3. The process of claim 1 wherein said organometallic compound is a tetrakis (dialkylamido) titanium.

4. The process of claim 1 wherein said organometallic compound is a tetrakis (dimethylamido) titanium.

5. The process of claim 1 wherein said plasma is generated by a microwave discharge.

* * * * *